United States Patent
Sugaya (10) Patent No.: US 7,253,479 B2
(45) Date of Patent: Aug. 7, 2007

(54) SEMICONDUCTOR DEVICE WITH CAVITY AND METHOD OF MANUFACTURE THEREOF

(75) Inventor: Hiroyuki Sugaya, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/362,737

(22) Filed: Feb. 28, 2006

(65) Prior Publication Data

US 2006/0194410 A1     Aug. 31, 2006

(30) Foreign Application Priority Data

Feb. 28, 2005   (JP)   ............... 2005-052749

(51) Int. Cl.
    *H01L 27/01*   (2006.01)
    *H01L 21/00*   (2006.01)
(52) U.S. Cl. .................. 257/347; 257/419; 438/52; 438/53
(58) Field of Classification Search ........... 438/149, 438/151, 164, 52, 53, 221, 427; 257/347, 257/349, 352, 415, 417–419
    See application file for complete search history.

(56) References Cited

U.S. PATENT DOCUMENTS 5,427,975 A * 6/1995 Sparks et al. ............. 438/52
5,736,430 A * 4/1998 Seefeldt et al. ............ 438/53
2003/0209814 A1 * 11/2003 Farrar et al. .............. 257/797
2005/0176222 A1 * 8/2005 Ogura ...................... 438/514
2006/0060921 A1 * 3/2006 Takizawa et al. ......... 257/347

FOREIGN PATENT DOCUMENTS

| JP | 2001-144276 | 5/2001 |
| JP | 2003-332540 | 11/2003 |

OTHER PUBLICATIONS

U.S. Appl. No. 09/650,748, filed Aug. 30, 2000, Tsutomu Sato.

* cited by examiner

*Primary Examiner*—Kevin M. Picardat
(74) *Attorney, Agent, or Firm*—Oblon, Spivak, McClelland, Maier & Neustadt, P.C.

(57) ABSTRACT

A semiconductor device is provided with a substrate with a cavity inside, the substrate including a device formation area located above the cavity, a plurality of trenches formed in the substrate to communicate with the cavity and surround the device formation area, and an oxide film formed around each of the trenches to continuously surround the device formation area.

17 Claims, 8 Drawing Sheets

SEMICONDUCTOR DEVICE WITH CAVITY AND METHOD OF MANUFACTURE THEREOF

CROSS-REFERENCE TO RELATED APPLICATIONS

This application is based upon and claims the benefit of priority from prior Japanese Patent Application No. 2005-052749, filed on Feb. 28, 2005, the entire contents of which are incorporated herein by reference.

BACKGROUND OF THE INVENTION

1. Field of the Invention

The present invention relates to a semiconductor device of the silicon on nothing (SON) structure and a method of manufacture thereof.

2. Description of the Related Art

The SON structure has attracted attention in which a cavity is formed below a device formation area in a substrate in order to reduce the power consumption of and increase the operating speed of semiconductor devices. A method of forming a fine SON structure has been developed which involves forming a shallow-trench device isolation region (STI) in a substrate, then forming two or more fine cavities in the substrate by ion implantation, and growing the cavities by heat treatment so that they are integrated into a large cavity in contact with the device isolation region (see, for example, Jpn. Pat. Appln. KOKAI Publication No. 2003-332540). With this method, after the device isolation region has been formed in a substrate, a cavity is formed in contact with the device isolation region; thus, the device formation area above the cavity can be supported by the device isolation region without sink.

Also, a technique is known which involves forming two or more trenches in a substrate, then forming a device formation area made of silicon by melting the substrate portions located around the trench through heat treatment. By so doing, the trenches are integrated into a cavity which is larger in size than the trenches and located inside the substrate. When the cavity is thus formed first, trying to form a device isolation region in the form of trench so that it is in contact with the cavity and surrounds a device formation area results in falling of the device formation area due to the loss of its support. It is therefore difficult to form the device formation area in contact with the cavity. Accordingly, one might suggest forming a device isolation region in the form of trench which continuously surrounds a device formation area while leaving portions of the substrate around the cavity to support the device formation area. In that case, however, even if the substrate portions supporting the device formation area were insulated at a later time, the device formation area would have portions which are not isolated by the cavity from the underlying silicon substrate. This would result in an increase in parasitic capacitance, making it difficult to reduce the power consumption of the device. Accordingly, there is a demand for a semiconductor device of the SON structure and a method of manufacture thereof which permits the device formation area to be supported with certainty, the parasitic capacitance to be prevented from increasing, and the power consumption to be reduced.

BRIEF SUMMARY OF THE INVENTION

According to an aspect of the present invention, there is provided a semiconductor device comprising: a substrate with a cavity inside, the substrate including a device formation area located above the cavity; a plurality of trenches formed in the substrate to communicate with the cavity and surround the device formation area; and an oxide film formed around each of the trenches to continuously surround the device formation area.

According to another aspect of the present invention, there is provided a method of manufacturing a semiconductor substrate comprising: forming a cavity inside a substrate; forming a plurality of first trenches in a surface portion of the substrate so that each of the first trenches communicates with the cavity; and forming an oxide film to continuously surround the surface portion of the substrate above the cavity by oxidizing the substrate around the first trenches.

BRIEF DESCRIPTION OF THE SEVERAL VIEWS OF THE DRAWING

FIGS. 15A through 15F show a modification of the method of manufacture of a cavity.

DETAILED DESCRIPTION OF THE INVENTION

The embodiments of the present invention will be described hereinafter with reference to the accompanying drawings.

FIRST EMBODIMENT

Figure 1:
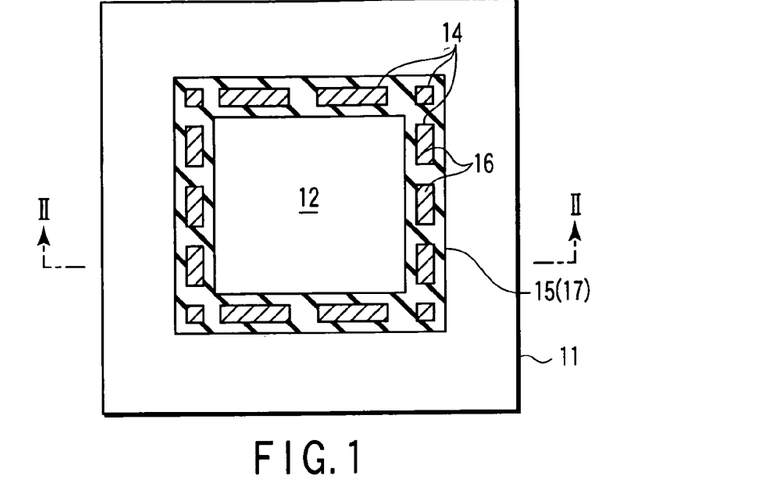
FIG. 1 is a plan view of a semiconductor device according to a first embodiment.
Figure 2:
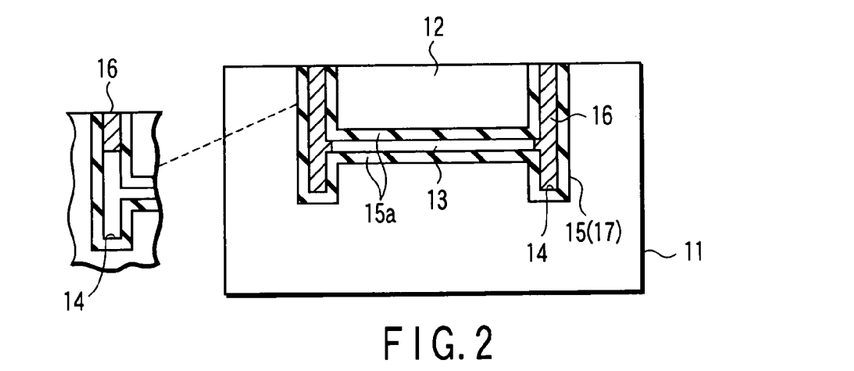
FIG. 2 is a sectional view taken along line II-II of FIG. 1.

FIGS. 1 and 2 show a semiconductor device according to a first embodiment. This semiconductor device is applied to a power MOS transistor or power bipolar transistor by way of example.

In FIGS. 1 and 2, a silicon substrate 11 is formed inside with a cavity 13 below a device formation area 12. A plurality of trenches 14 is formed at regularly spaced intervals around the device formation area 12. A silicon oxide film 15 forming a device isolation region 17 is continuously formed around each trench 14 in contact with the device formation area 12 and the cavity 13. The silicon oxide film 15 is also formed on the inner wall of the silicon substrate portion that is in contact with the cavity 13, as shown in FIG. 2. The silicon oxide film 15a in contact with the cavity 13 and the silicon oxide film 15 around each trench 14 are integrated with each other. For this reason, the device formation area 12 is electrically isolated at its bottom from the substrate 11 below the cavity 13 by means of the cavity having a relative permittivity of about "1". The device isolation area is also isolated from its surrounding area by the silicon oxide film 15. Therefore, the parasitic capacitance and power consumption can be reduced. Each of the trenches 14 is filled with polysilicon 16 which is nearly equal to silicon in coefficient of thermal expansion. It is therefore possible to prevent defects from occurring in surrounding portions of the trenches 14 and the oxide film 15 in heat treatment at the time of device formation by way of example.

FIGS. 3 through 10 show the method of manufacturing the semiconductor device of the first embodiment.

Figure 3:
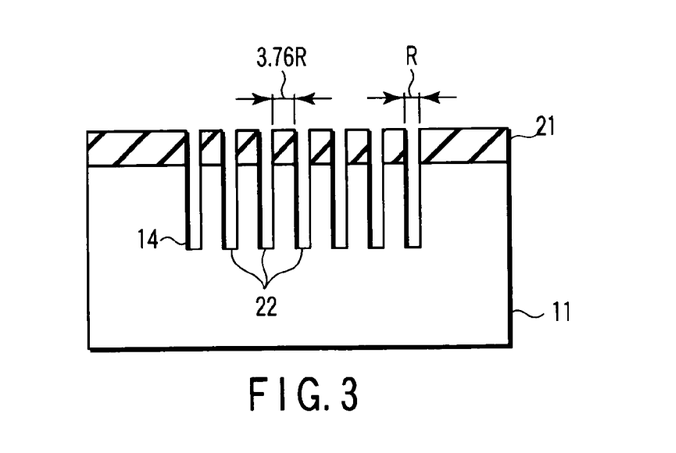
FIG. 3 is a sectional view illustrating the method of manufacture of the semiconductor device of the first embodiment.

First, a plurality of trenches is formed regularly and densely to conform to the device formation area of a silicon substrate 11. That is, as shown in FIG. 3, the substrate 11 is formed on top with a silicon oxide film 21 as a mask material. The silicon oxide film 21 is then etched into a desired pattern using a resist pattern not shown as a mask. After that, the resist pattern is removed and then the substrate 11 is etched by means of a reactive ion etching (RIE) using the silicon oxide film 21 as a mask to form a plurality of trenches 22. The planar shape of the opening of each trench is, for example, circular and its aspect ratio is of the order of seven. The spacing of the trenches 22 is set below 3.76R, for example, where R is the diameter of the trench.

Figure 4:
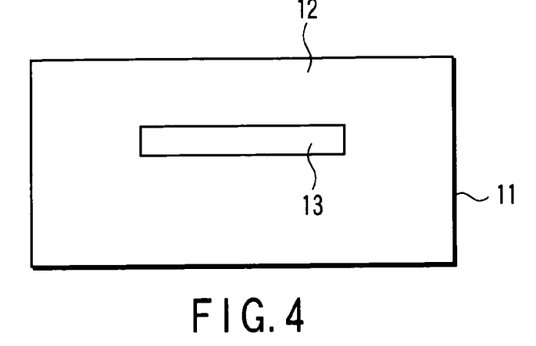
FIG. 4 is a sectional view illustrating a manufacturing step following the step of FIG. 3.

Next, heat treatment is carried out in a hydrogen ($H_2$) atmosphere under conditions of a temperature of 1100° C. and a gas pressure of the order of 300 Torr. Thereby, the substrate portions around the trenches 22 are fused to form the device formation area 12 and the trenches 22 are integrated to form the cavity 13 in the portion of the substrate below the device formation area, as shown in FIG. 4.

Figure 5:
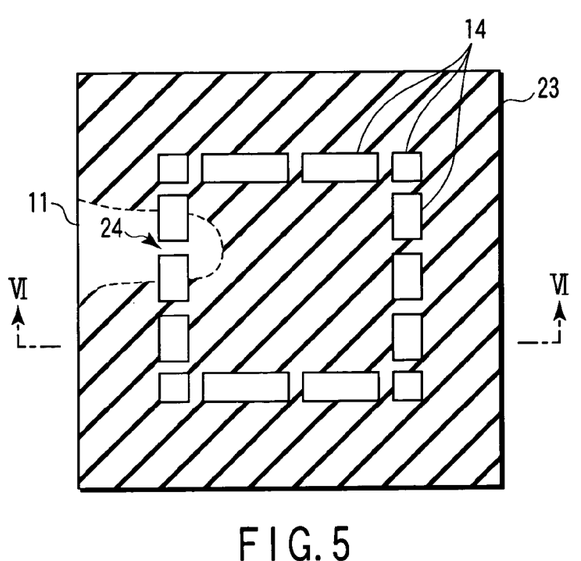
FIG. 5 is a plan view illustrating a manufacturing step following the step of FIG. 4.
Figure 6:
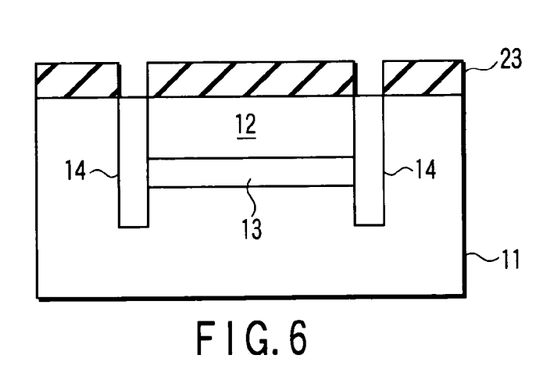
FIG. 6 is a sectional view taken along line VI-VI of FIG. 5.

After that, as shown in FIGS. 5 and 6, a silicon oxide film 23 as a mask material is formed over the entire surface of the substrate 11. The silicon oxide film 23 is then etched through RIE using a resist pattern not shown into a desired mask pattern. At this time, the resist is patterned so that the silicon oxide film 23 is left on portions which will form the supports of the device formation area 12 above the cavity 13 and one side of each trench to be subsequently formed will be aligned with the edge of the cavity. The silicon oxide film 23 is etched through RIE with the resist pattern as a mask and then the resist is peeled off.

Next, a plurality of trenches 14 is formed by means of RIE using the patterned silicon oxide film 23 as a mask. The resulting trenches 14 will communicate with the cavity 13. The presence of the silicon supports 24 between each trench 14 will prevent the device formation area 12 from falling. From the point of view of holding the device formation area 12, it is desirable to increase the width of the supports 24. However, increasing the width too much may result in an increase in parasitic capacitance. If the width of the supports 24 is increased, it will become necessary to increase the thickness of an oxide film formed in a subsequent step of oxidizing all the supports 24. When the thickness of the oxide film is increased, the device formation area 12 is subjected to stress and defects are liable to occur. For this reason, it is desirable that the width of the supports 24 be defined by the minimum dimension used in forming the resist pattern, patterning the silicon oxide film 23, and forming the trenches 14. At present, the minimum dimension is approximately 0.3 µm.

Figure 7:
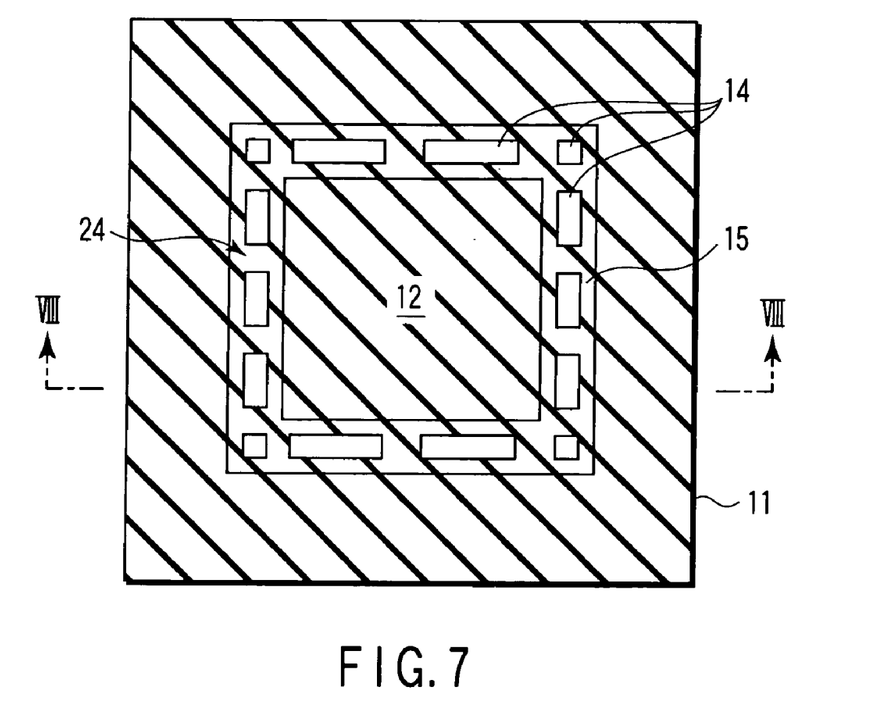
FIG. 7 is a plan view illustrating a manufacturing step following the step of FIG. 5.
Figure 8:
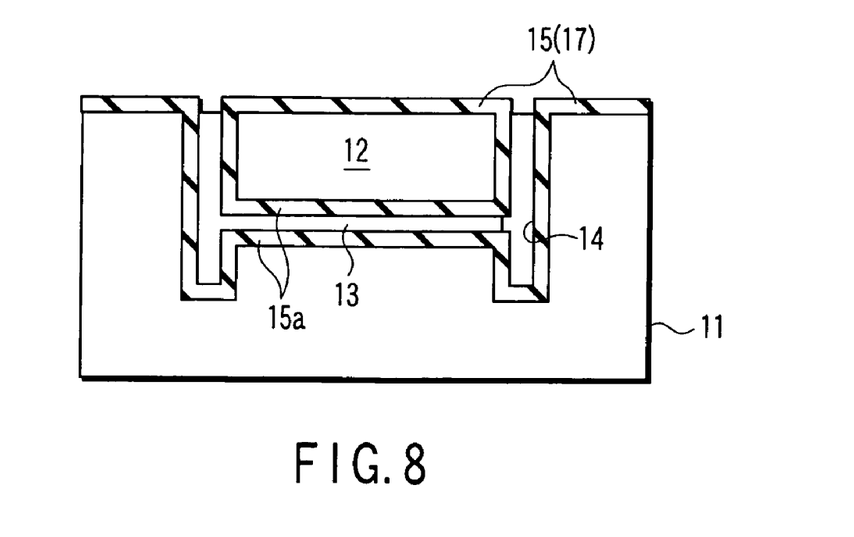
FIG. 8 is a sectional view taken along line VIII-VIII of FIG. 7.

Next, as shown in FIGS. 7 and 8, the silicon oxide film 23 is removed. After that, in order to oxidize all the silicon supports 24, the substrate 11 undergoes heat treatment in an oxidizing atmosphere to oxidize the inner walls of the trenches 14, the inner walls of the silicon substrate portion that is in contact with the cavity 13, and the surface of the substrate 11. Here, heat treatment is simply performed such that a silicon oxide film 15 having a thickness of not less than 1.0 times of the width of the supports 24. This is because silicon that forms the supports 24 combines with oxygen and hence the thickness of the oxide film 15 formed between the trenches 14 after all the supports have been oxidized becomes about twice the width of the silicon supports 24 before heat treatment. Thus, the silicon oxide film 15 that forms the device isolation region 17 around the device formation area 12 is formed at a thickness of the order of not less than half of the thickness of the silicon oxide film 15 resulting from the silicon support 24 between each trench 14 being oxidized.

Figure 9:
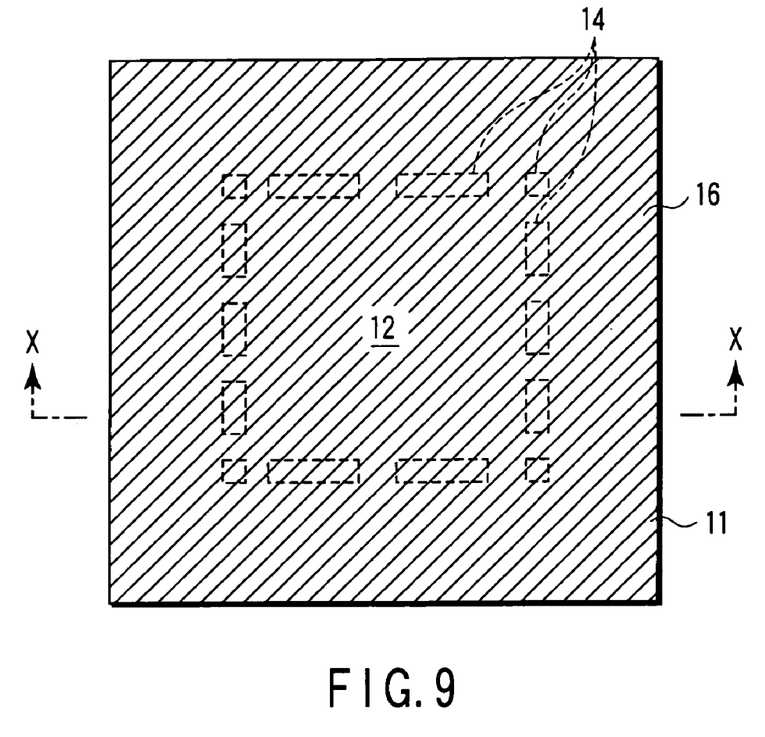
FIG. 9 is a plan view illustrating a manufacturing step following the step of FIG. 7.
Figure 10:
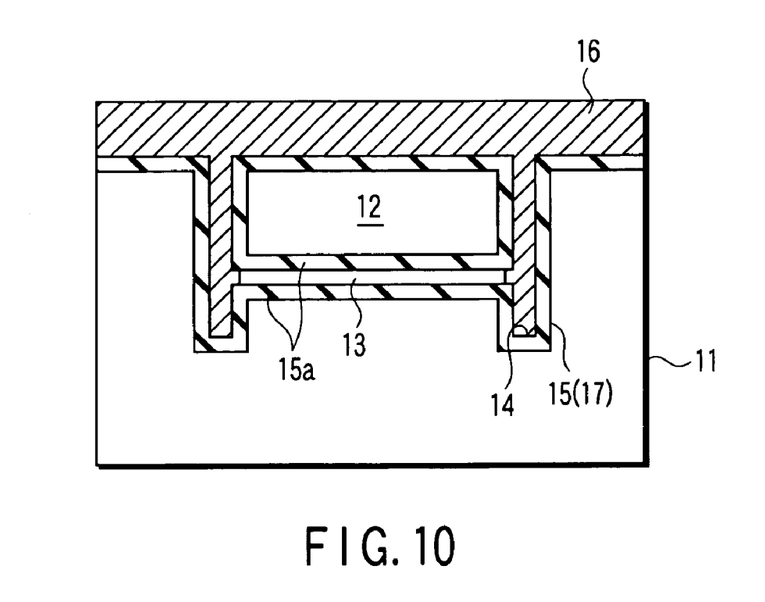
FIG. 10 is a sectional view taken along line X-X of FIG. 9.

After that, as shown in FIGS. 9 and 10, a polysilicon film 16 is formed over the entire surface of the substrate. At this time, it is not necessary to fill up the trenches 14 with the polysilicon film 16. To reduce parasitic capacitance, it is desirable not to form the polysilicon film 16 inside the trenches 14. However, if the inside of the trenches 14 were completely empty, subsequent heat treatment might cause defects to occur in the silicon oxide film 15 and the device formation area 12. To prevent this, the polysilicon film 16, which is nearly equal in thermal expansion coefficient to silicon, is formed inside the trenches 14. If the effect of thermal stress is little, therefore, the polysilicon film 16 may be formed to such a degree as to close the upper region of each trench, as shown in FIG. 2. In such a case, a vacancy is produced inside each trench.

Next, those portions of the polysilicon film 16 located on the substrate surface (including film portions located above the trench 14) are removed by means of chemical mechanical polishing (CMP), and the silicon oxide film 15 on the substrate 11 is removed through wet etching. Thus, the trenches 14 are filled with the polysilicon film 16, as shown in FIGS. 1 and 2.

After that, though not shown, a MOS transistor or bipolar transistor is formed in the device formation area 12.

According to the first embodiment, the trenches 14 are formed by leaving portions of the substrate 11 around the cavity 13 formed inside the substrate and the silicon oxide film 15 is formed on the inner wall of each trench. Thereby, the device isolation region 17 is continuously formed around the device formation region 12 located above the cavity 12. For this reason, the device formation area 12 is isolated from the adjacent device formation areas by the device isolation region 17 which is formed from the silicon oxide film 15. The bottom of the device formation area 12 is isolated from that portion of the substrate 11 which is located below the cavity 13 through the cavity having a relative permittivity of approximately "1". Therefore, parasitic capacitance between the device formation area and the silicon substrate can be reduced, thus allowing power consumption to be reduced.

The width of the support 24 between each trench can be defined by the minimum dimension used in forming the trenches. The minimum dimension is of the order of approximately 0.3 µm. The supports of this width can be oxidized from both sides of the inner walls of the trenches. Thus, the thickness of the silicon oxide film 15 formed on one inner wall of the trench can be suppressed to less than the thickness of an oxide film obtained by oxidizing the supports 24, in other words, to from half to less than 1 times the distance between trenches 14 after oxidization. Specifically, the oxide thickness may be of the order of 0.3 µm. For this reason, heat treatment for forming the silicon oxide film 15 can be carried out in a short time, thus allowing the occurrence of crystal defects in the substrate 11 to be suppressed.

The trenches 14 are filled with polysilicon which is nearly equal in thermal expansion coefficient to silicon. This prevents defects from occurring in regions around the trenches in thermal treatment.

The material with which the trenches are to be filled is not limited to polysilicon. It is also possible to use a silicon oxide film formed by chemical vapor deposition (CVD) or an insulating film of silica particles formed by the spin coat method, provided that no defects occur in the device formation area 12.

SECOND EMBODIMENT

Figure 11:
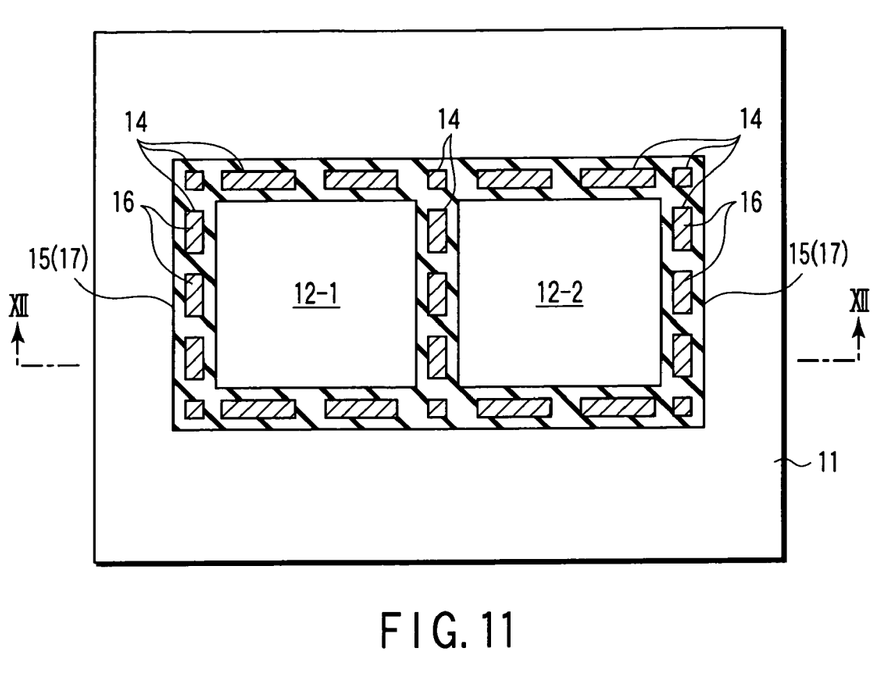
FIG. 11 is a plan view of a semiconductor device according to a second embodiment.
Figure 12:
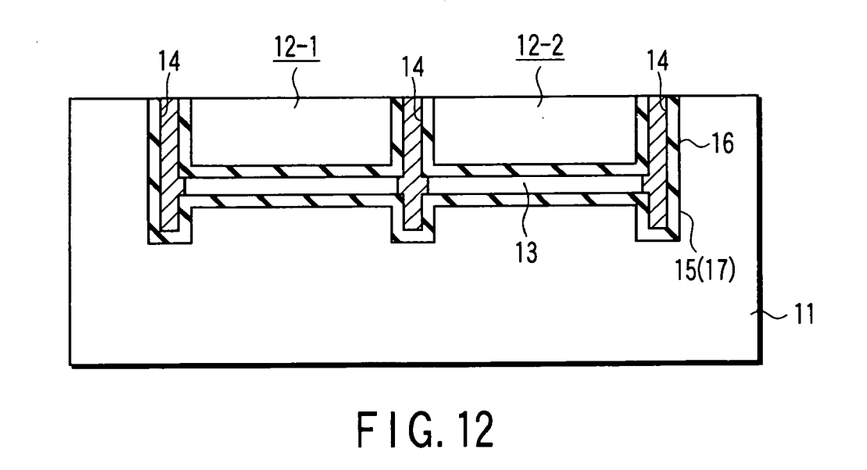
FIG. 12 is a sectional view taken along line XII-XII of FIG. 11.

FIGS. 11 and 12 show a semiconductor device according to a second embodiment. In the first embodiment, a device isolation region is formed around one device formation area corresponding to one cavity. In contrast, in the second embodiment, a device isolation region is formed to isolate two or more device formation areas corresponding to one cavity.

FIGS. 11 and 12 show a case in which two device formation areas 12-1 and 12-2 are formed in a substrate 11. In this case, first, one cavity 13 is formed which has a size corresponding to the device formation areas 12-1 and 12-2. The method of forming the cavity remains unchanged from that in the first embodiment. Then, a plurality of trenches 14 is formed around the device formation areas 12-1 and 12-2. At this time, as in the first embodiment, a portion of silicon is left between the trenches 14, thus allowing the device formation areas 12-1 and 12-2 to be prevented from falling.

Figure 13:
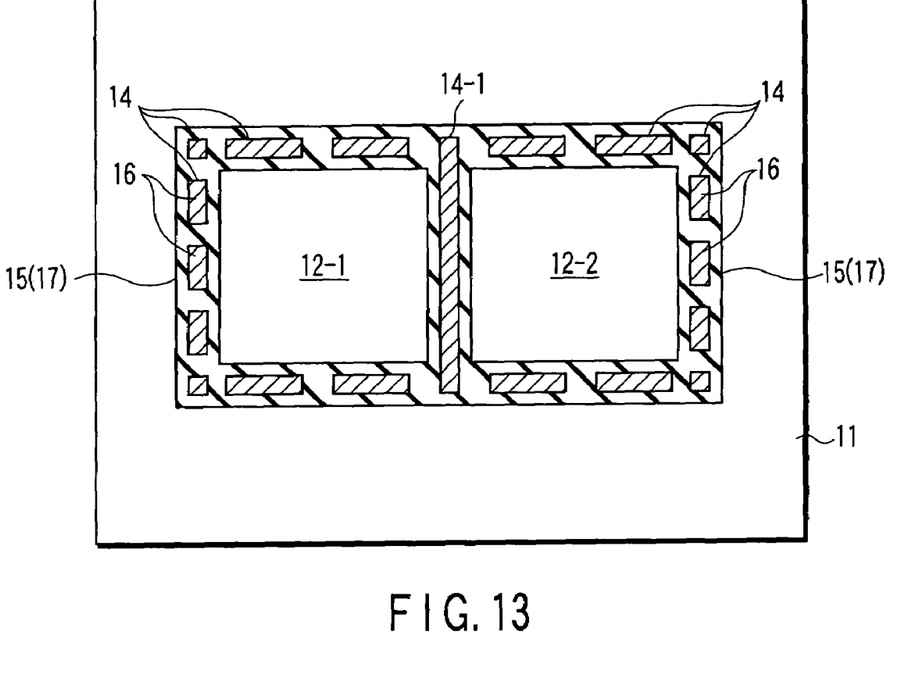
FIG. 13 is a plan view of a semiconductor device according to a modification of the second embodiment.

In FIG. 11, a portion of silicon (silicon support) is shown left between the trenches 14 formed between the device formation areas 12-1 and 12-2. If the device formation areas 12-1 and 12-2 can be supported with certainty by only the silicon supports left between the trenches 14 formed around the device formation areas, then the silicon supports associated with the trenches between the device formation areas will not need to be left. In such a case, a continuous trench 14-1 may be formed between the device formation areas 12-1 and 12-2 as shown in FIG. 13.

After that, as in the first embodiment, a silicon oxide film 15 forming a device isolation region 17 is formed over the substrate surface and the trenches 14 (14-1) are filled with a polysilicon film 16.

According to the second embodiment, the cavity 13 is formed first to conform to the size of the device formation areas 12-1 and 12-2 and then the trenches 14 and 14-1 are formed around the device formation areas. After that, silicon around the trenches is oxidized. Thereby, the device formation areas 12-1 and 12-2 and the device isolation region 17 can be formed at the same time.

Moreover, the trenches 14 and 14-1 are formed at regularly spaced intervals around each of the device formation areas 12-1 and 12-2 and a silicon support is left between each trench. Even in the case where the device formation areas 12-1 and 12-2 and the device isolation region 17 are formed at the same time, therefore, the device formation areas can be supported with certainty and prevented from sinking.

In the second embodiment, a large cavity 13 is formed to form two or more device formation areas 12-1 and 12-2. In general, with a small cavity, when silicon is melted in subsequent heat treatment, the cavity is liable to become round in sectional shape so that the surface energy decreases. With such a cavity which is round in sectional shape, it is known that parasitic capacitance increases. When the cavity is large as in the second embodiment, however, its sectional shape can be kept nearly rectangular. It is therefore possible to check an increase in parasitic capacitance.

The first and second embodiments can also be applied to devices using such fine-trench isolation as used in the shallow trench isolation (STI). Therefore, the first and second embodiments are not limited to high-voltage devices, such as MOS power transistors or bipolar power transistors, and are applicable to logic circuits, memory circuits (e.g., floating body cell memories), etc.

Figure 14:
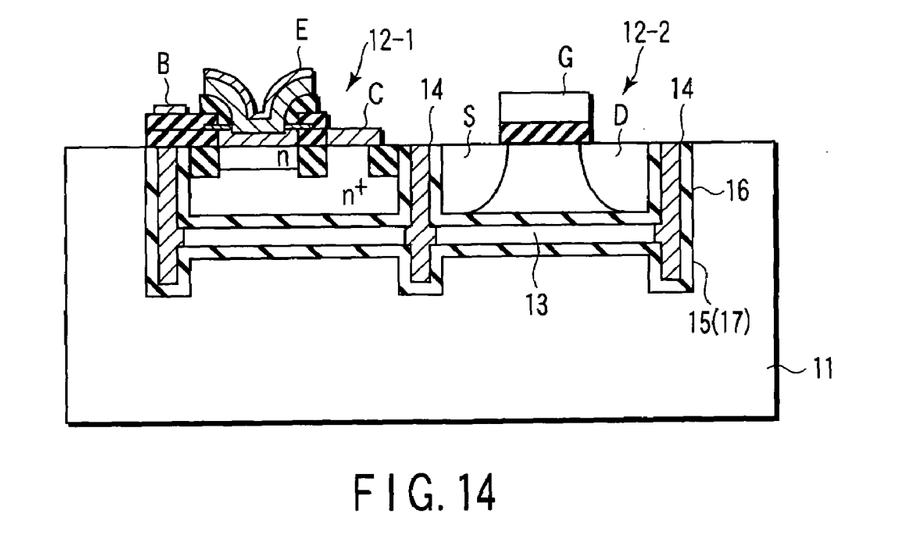
FIG. 14 is a sectional view of the semiconductor device of the second embodiment which is formed with circuit elements.

FIG. 14 shows the formation of circuit elements in the device formation areas 12-1 and 12-2 in the structure shown in FIG. 12. For example, a vertical bipolar transistor is formed in the device formation area 12-1 and a completely depleted MOS transistor is formed in the device formation area 12-2.

The second embodiment may be applied to a device in which a cavity is formed to conform to three or more device formation areas.

The method of forming a cavity inside a substrate is not limited to that in the first and second embodiments.

FIGS. 15A through 15F show a modified method of forming a cavity, which use separation by implanted oxide (SIMOX).

Figure 15A:
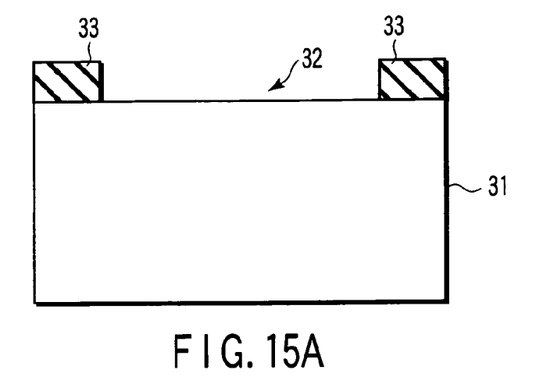
FIGS. 15A and 15B are sectional views.
Figure 15B:
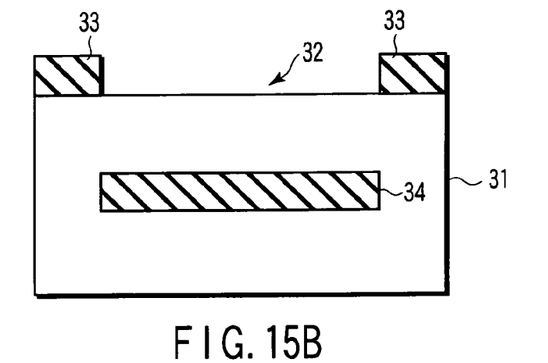

As shown in FIG. 15A, a mask layer 33 of silicon oxide is formed to conform to a device formation area 32 of a substrate 31. After that, as shown in FIG. 15B, oxygen ions are implanted into the substrate 31 using the mask layer 33 as a mask. This implantation process is carried out at 180 keV with a dose of $2 \times 10^{18}$ cm$^{-2}$ by way of example. After that, the substrate 31 is subjected to a heat treatment process in a nitrogen atmosphere, whereby a silicon oxide film 34 is formed inside the substrate 31. The heat treatment process is carried out at 1280° C. for six hours, for example.

Figure 15C:
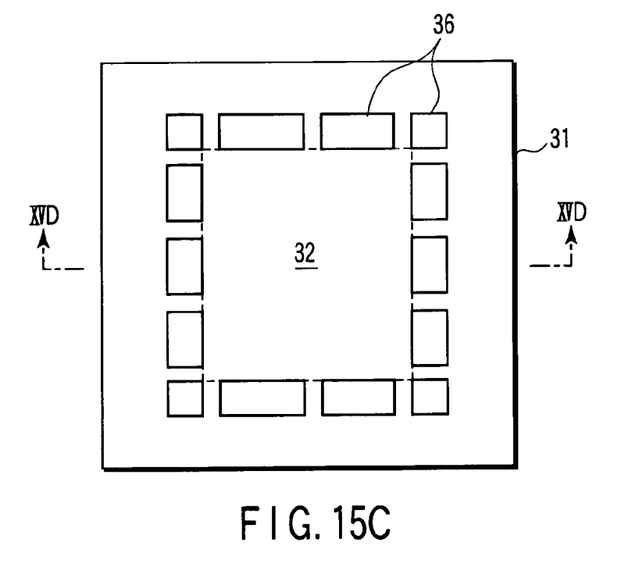
FIG. 15C is a plan view.
Figure 15D:
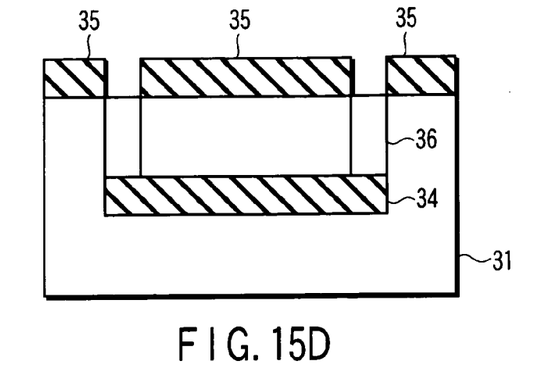
FIG. 15D is a sectional view taken along line XVD-XVD of FIG. 15C.

Next, the mask layer 33 is removed and then a mask layer 35 is formed to expose portions of the periphery of the device formation area 32. The substrate is etched with the mask layer 35 as a mask to form trenches 36 around the device formation area 32 as shown in FIGS. 15C and 15D. The silicon oxide film 34 is partly exposed through these trenches.

Figure 15E:
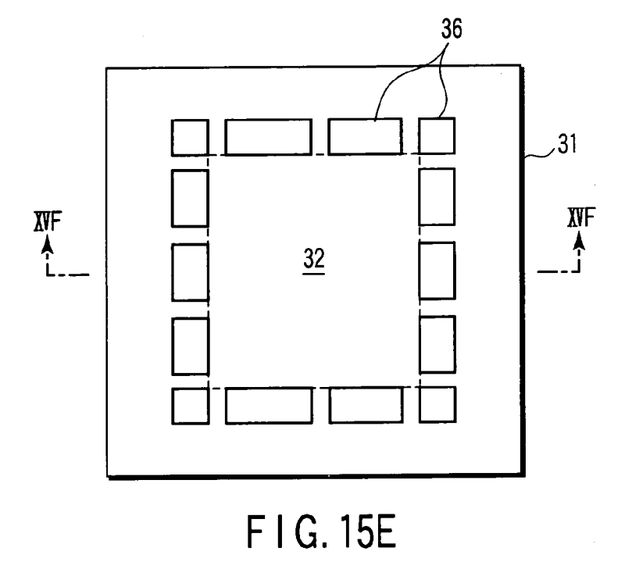
FIG. 15E is a plan view.
Figure 15F:
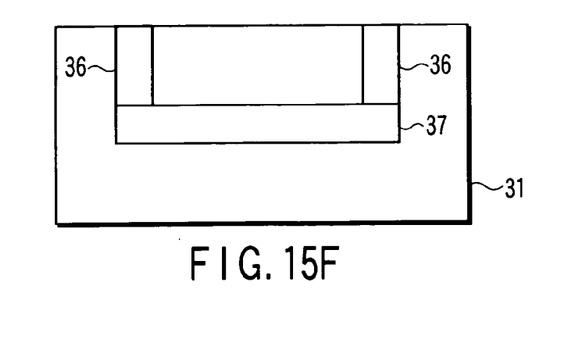
FIG. 15F is a sectional view taken along line XVF-XVF of FIG. 15E.

After that, the silicon oxide film 34 is removed through the trenches 36 by means of wet etching. As the result, a cavity 37 is formed below the device formation area 32. Then, an oxide film is formed on the inner walls of the trenches 36 and on the inner wall of the substrate portion that is in contact with the cavity 37 in the same manner as in the first and second embodiments. Further, the trenches 36 are filled with polysilicon. This manufacturing method will offer the same advantages as the first and second embodiments.

In each of the embodiments described above, the oxide film formed around the device formation area may contain nitrogen. The addition of nitrogen enhances the electric insulating property (dielectric breakdown characteristic) of the oxide film. The oxide film may contain fluorine instead of nitrogen. The addition of fluorine reduces stress which may be generated in the corner portions of trenches, and further decreases the permittivity of the oxide film, thereby reducing the power consumption of the device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a substrate with a cavity inside, the substrate including a device formation area located above the cavity;
   a plurality of trenches formed in the substrate to communicate with the cavity and surround the device formation area; and
   an oxide film as a device separation region formed around each of the trenches to continuously surround the device formation area.

2. The device according to claim 1, further comprising a material formed inside the trenches.

3. The device according to claim 2, wherein the material is formed in an upper portion of each of the trenches.

4. The device according to claim 2, wherein the material has a thermal expansion coefficient substantially equal to the thermal expansion coefficient of the substrate.

5. The device according to claim 2, wherein the material includes a major constituent selected from polysilicon, silica, and silicon oxide.

6. The device according to claim 1, wherein thickness of the oxide film is not less than half of the distance between the trenches.

7. The device according to claim 1, wherein, of the trenches, trenches between adjacent the device formation areas are formed continuously.

8. The device according to claim 1, further comprising a MOS transistor formed in the device formation area.

9. The device according to claim 1, further comprising a bipolar transistor formed in the device formation area.

10. A method of manufacturing a semiconductor substrate comprising:
    forming a cavity inside a substrate;
    forming a plurality of first trenches in a surface portion of the substrate so that each of the first trenches communicates with the cavity; and
    forming an oxide film as a device separation region to continuously surround the surface portion of the substrate above the cavity by oxidizing the substrate around the first trenches.

11. The method according to claim 10, further comprising filling the first trenches with a material.

12. The method according to claim 11, wherein an upper portion of each of the first trenches is filled with the material.

13. The method according to claim 11, wherein the material has a thermal expansion coefficient substantially equal to the thermal expansion coefficient of the substrate.

14. The method according to claim 11, wherein the material includes a major constituent selected from polysilicon, silica, and silicon oxide.

15. The method according to claim 10, wherein a thickness of the oxide film is not less than half of the distance between the first trenches.

16. The method according to claim 10, wherein the forming the cavity comprises forming a plurality of second trenches in the surface portion of the substrate, the second trenches reach to a area corresponding to the cavity formation area; and melting the substrate portions located around the second trenches by heat treatment of the substrate to form the device formation area and the cavity below the device formation area.

17. The method according to claim 10, wherein the forming the cavity comprises forming an insulating layer inside the substrate to conform to the device formation area by implanting oxygen ions into a depth corresponding to the cavity formation area; forming the first trenches in contact with the periphery of the insulating layer; and removing the insulating layer through the first trenches by using wet etching.

* * * * *